United States Patent [19]

Izawa et al.

[11] Patent Number: 5,053,849
[45] Date of Patent: Oct. 1, 1991

[54] TRANSISTOR WITH OVERLAPPING GATE/DRAIN AND TWO-LAYERED GATE STRUCTURES

[75] Inventors: Ryuichi Izawa; Tokuo Kure, Kokubunji; Shimpei Iijima, Akishima; Eiji Takeda Koganei; Yasuo Igura, Hachioji; Akemi Hamada, Tokorozawa; Atsushi Hiraiwa, Kodaira, all of Japan

[73] Assignee: Hitachi, Ltd., Tokyo, Japan

[21] Appl. No.: 515,659

[22] Filed: Apr. 25, 1990

Related U.S. Application Data

[63] Continuation of Ser. No. 185,541, Apr. 25, 1988, abandoned.

[30] Foreign Application Priority Data

| Apr. 24, 1987 | [JP] | Japan | 62-99765 |
| Jul. 16, 1987 | [JP] | Japan | 62-175854 |
| Sep. 25, 1987 | [JP] | Japan | 62-238713 |

[51] Int. Cl.⁵ .................. H01L 49/02; H01L 29/04; H01L 23/48
[52] U.S. Cl. ......................... 357/59; 357/6; 357/23.5; 357/23.9; 357/23.14; 357/54; 357/71
[58] Field of Search ............. 357/23.3, 23.5, 23.9, 357/41, 42, 59, 23.1, 71, 6, 54, 23.14

[56] References Cited

U.S. PATENT DOCUMENTS

| 3,892,606 | 7/1975 | Chappelow et al. | 357/23.9 |
| 4,085,498 | 4/1978 | Rideout | 357/23.9 |
| 4,128,670 | 12/1978 | Gaensslen | 357/23.9 |
| 4,141,022 | 2/1979 | Sigg et al. | 357/23.9 |
| 4,329,706 | 11/1982 | Crowder et al. | 357/23.9 |
| 4,394,182 | 7/1983 | Maddox, III | 357/23.3 |
| 4,477,962 | 10/1984 | Godejohn, Jr. | 357/23.9 |
| 4,559,694 | 12/1985 | Yoh et al. | 357/41 |
| 4,577,391 | 3/1986 | Hsia et al. | 357/23.9 |
| 4,663,645 | 5/1987 | Komori et al. | 357/23.5 |
| 4,700,215 | 10/1987 | McPherson | 357/67 |
| 4,702,937 | 10/1987 | Yamoto et al. | 357/59 |
| 4,754,320 | 7/1988 | Mizutami et al. | 357/41 |
| 4,755,865 | 7/1988 | Wilson et al. | 357/23.3 |
| 4,807,013 | 2/1989 | Manocha | 357/23.1 |
| 4,907,048 | 3/1990 | Huang | 357/71 |

FOREIGN PATENT DOCUMENTS 58-54668  3/1983  Japan ........................ 357/23.5

OTHER PUBLICATIONS

S. M. Sze, *Semiconductor Devices, Physics and Technology*, John Wiley & Sons, New York (1985), p. 344.

*Primary Examiner*—J. Carroll
*Attorney, Agent, or Firm*—Antonelli, Terry, Stout & Kraus

[57] ABSTRACT

Herein disclosed is a semiconductor device of high density. The semiconductor device having a high density and a microstructure is required to have a high breakdown voltage and a high speed even with a low supply voltage. The semiconductor device comprises: a semiconductor body; a gate insulating film formed over the body; and a MOS transistor having a source/drain region formed in the body and a gate electrode film formed over the gate insulating film. The gate electrode film is composed of two or more films having different etching rates. The gate etching is stopped at the interface of the composite film to form an inverse-T gate electrode structure; and in that an electric conduction is observed between the component films. Thus, the overlap between the gate and the drain can be controlled.

22 Claims, 14 Drawing Sheets

TRANSISTOR WITH OVERLAPPING GATE/DRAIN AND TWO-LAYERED GATE STRUCTURES

This application is a continuation of application Ser. No. 07/185,541, filed on Apr. 25. 1988, abandoned.

BACKGROUND OF THE INVENTION

The present invention relates to a semiconductor device or a ULSI composed of MOS transistors and, more particularly, to an integrated circuit device of high breakdown voltage, high speed and high density.

The density of the LSI such as the DRAM has advanced at a rate of four times every three years. The gate length of the MOS transistors composing the LSI has also gradually been micronized to less than 0.5 μm at present. As this micronization advances, the problem of reliability is becoming serious. In order to solve this problem, the device structure is changing from the SD (Single Drain) through the DDD (Double Diffused Drain) to the LDD (Lightly Doped Drain). These techniques are disclosed in Japanese Patent Laid-Open No. 53-78181, for example. In accordance with these changes, the integrated circuit device of the prior art has its transistor structure replaced thoroughly.

As the field effect transistors of the prior art, on the other hand, there is a transistor which has an inverse-T gate electrode structure. This transistor is discussed in IEDM86, pp. 742, "A Novel Submicron LDD Transistor with Inverse-T Gate Structure".

In this prior art technique, the portion (which will be referred to the "side-wall gate") forming part of an inverse-T gate electrode and overhanging the lower side of the same gate electrode is thinned. This is because an ion implantation for source and drain formations is accomplished through that thin side-wall gate electrode.

Thus, the inverse-T side-wall gate is formed by not completely etching out but leaving the areas other than a gate pattern at the gate electrode etching step such as the reactive ion etching step in accordance with the above-specified report.

We have examined the prior art described above and have found the following problems.

The control of etching the side-wall gate is seriously difficult for the prior art. Specifically, only the control of etching will make it difficult to control the remaining thickness of the side-wall gate because of dispersions of the temperature, time and initial thickness. The lightly doped source and drain of the transistor having that structure are formed by the ion implantation through the thin gate electrode film overhanging in the inverse-T form. Unless the etching of the side-wall gate could then be controlled, there would arise a problem that the impurity profile of the lightly doped source and drain cannot be controlled.

The prior art described above is further followed by a problem that the electric resistance of the side-wall gate increases to delay gate line signals because the side-wall gate is thin.

SUMMARY OF THE INVENTION

The present invention relates to a semiconductor device capable of forming an underlaying gate electrode with excellent control of etching and a process for fabricating the same. The present invention is characterized either by forming a film of different etching rate between an underlying gate electrode and an overlying gate electrode or by making the etching rates of the underlying gate electrode and the overlying gate electrode different from each other.

Specifically, the present invention is achieved such that a gate electrode film is composed of a film of a lower etching rate and a film of a higher etching rate overlapping each other. The composite film may be composed of three layers, and it is then necessary to form a thin film of a lower etching rate between the remaining side-wall film and the overlying film to be etched away.

If the film of a lower etching rate is overlapped by the film of a higher etching rate, the etching characteristics obtained are that the etching looks as if it were interrupted in the boundary of those films. Therefore, a film overhanging in the inverse-T form with an excellently controllable thickness can be formed if the side-wall gate is formed of a film having a lower etching rate or overlapped by a thin film of a lower etching rate.

Moreover, the present invention provides a structure for dropping the resistance of the side-wall gate.

Specifically, the semiconductor device of the present invention is characterized in that the thickness of the side-wall gate is not small as a final structure but is similar to that of the main gate electrode. On the other hand, the fabrication process is characterized in that the side-wall gate is not present or has a small thickness when in an ion implantation for forming the source/drain region and in that a thick side-wall gate is formed after the ion implantation.

Specifically, the semiconductor device of the present invention comprises: a first gate electrode formed over a semiconductor substrate; a second gate electrode formed in at least one side-wall portion of said first gate electrode and having a thickness as equal as that of said first gate electrode; and a source/drain region formed in the surface area of said semiconductor substrate at the two sides of said first electrode.

On the other hand, the process for fabricating the semiconductor device of the present invention comprises: a first step of covering a semiconductor substrate with a first conductive film; a second step of forming a patterned masking layer in a portion of said first conductive film; a third step of isotropically or anisotropically etching said first conductive film with said masking layer; a fourth step of doping the surface area of said semiconductor substrate with an impurity with said masking layer to form a source/drain region; a fifth step of covering said semiconductor substrate with a second conductive film; and a sixth step of etching said second conductive film to leave a thick conductive film in at least one side-wall of said first conductive film.

According to the present invention, the second gate electrode (i.e., the side-wall gate) to be formed in the side wall of the first gate electrode is thick without any thin portion, as different from the prior art, so that a semiconductor device can be provided to have a low electric resistance at its gate electrode.

According to the fabrication method of the present invention, on the other hand, a side-wall electrode is not present or made thin, when in an ion implantation for forming the source/drain region, and a thick side-wall gate is added after the ion implantation so that the side-wall gate can raise no obstruction against the ion implantation to drop the electric resistance of the gate electrode.

An object of the present invention is to solve the problems specified hereinbefore. Specifically, the present invention has an object to provide an element structure for forming an inverse-T side-wall gate electrode with an excellently controllable thickness and a process for fabricating the element structure.

Another object of the present invention is to provide a semiconductor device having neither a portion of high electric resistance in its gate electrode nor a cause for delaying the gate line signals and a process for fabricating the same.

Still another object of the present invention is to provide a semiconductor device of high breakdown voltage, high speed and high density and a process for fabricating the same.

A further object of the present invention is to provide an element structure capable of easily controlling the overlap of its gate and drain and a process for fabricating the same.

A further object of the present invention is to provide a ULSI having high breakdown voltage, high speed and high density as a whole by separately using a variety of semiconductor devices.

These and other objects and many of the attendant advantages of the present invention will be readily appreciated as the same becomes better understood by reference to the following detailed description when considered in connection with the accompanying drawings.

DETAILED DESCRIPTION OF THE INVENTION

EMBODIMENT 1

Figure 1A:
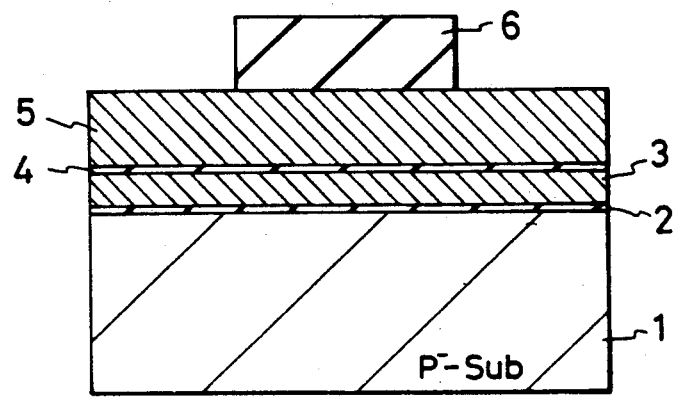
FIGS. 1A to 1E are sections for explaining a first embodiment of the present invention.

A first embodiment of the present invention will be described in the following with reference to the accompanying drawings.

FIGS. 1A to 1E each show a sectional structure of a gate electrode portion of a semiconductor device of the present invention and a process for fabricating the same.

A p⁻ type silicon substrate 1 is provided with an isolation oxide film defining an active device region by the LOCOS (Local Oxidation of Silicon) method. In practice, a thermal oxidation is accomplished at 1,000° C. for 100 minutes to form a silicon oxide film having a thickness of 5,500 Å (although not shown).

Next, the Si substrate 1 gets its active device region provided on its surface with a thin gate insulating film 2, and a polycrystalline silicon film 3 is then deposited by the CVD (Chemical Vapor Deposition) method.

The gate insulating film 2 is made of a silicon oxide film and thermally oxidized at 950° C. for 40 minutes to have a thickness of 150 Å.

The deposition of the polycrystalline silicon film 3 is carried out by supplying gases of SiH₄ and He at 620° C. for 6 minutes to form the polycrystalline silicon film 3 having a thickness of 500 Å.

The control of this polycrystalline silicon film 3 may be practically easy if the deposition time period is changed.

The polycrystalline silicon film 3 is once left open to the atmosphere, after having been deposited, to form a natural oxide film 4 thereon. The suitable thickness of this natural oxide film 4 is 5 to 10 Å. The natural oxide film 4 does not require any special step but can be formed by exposure to the atmosphere (which may be any if it is an atmosphere containing oxygen). The time period required for the natural oxide film 4 to be formed with the thickness of 5 to 10 Å over the polycrystalline silicon film 3 is about 1 to 10 minutes. This is the case of deposition at a room temperature (at about 20° C.).

After the natural oxide film 4 is formed, a polycrystalline silicon film 5 is deposited again by the CVD method. After this, the polycrystalline silicon films 5 and 3 are doped with phosphorus (P).

The polycrystalline silicon film 5 is deposited at 620° C. for 19 minutes by supplying gases of SiH₄ and He to have a thickness of 1,500 Å.

The doping with phosphorus is accomplished by the phosphorus diffusion method under the following conditions:

The temperature is at 875° C.; the time period is 30 minutes; and gas atmosphere is PH₃.

If the polycrystalline silicon film 5 is doped with phosphorus (P), as will be described in the following, the polycrystalline silicon film 3 is also doped with the phosphorus (P) through the natural oxide film 4 to drop their resistance to a sufficiently low value.

Next, a silicon oxide film 6 is deposited by the CVD method. This silicon oxide film 6 is formed to have a thickness of 3,000 Å by supplying gases of N₂O and SiH₄ at 800° C. for 150 minutes.

Next, the silicon oxide film 6 (which will be referred to as the "SiO₂ film") is patterned to have the same shape as that of a gate electrode by using the photolithography.

FIG. 1A shows a sectional structure after the SiO₂ film is anisotropically etched by using a (not shown) photoresist film as a mask.

This anisotropic etching is accomplished by the RIE method under the following conditions:

The etching gas is CHF₃; and the pressure is 0.2 Torr; and the power is 0.5 W/cm².

Next, the polycrystalline silicon film 5 is etched with a microwave plasma etching by using the SiO₂ film 6 as a mask. This microwave plasma etching is featured by lowering the etching rate of the natural oxide film 4 (or enlarging the selection ratio), as compared with the polycrystalline silicon film 5. As a result, the etching of the polycrystalline silicon film 5 can be terminated at the natural oxide film 4.

The following methods and conditions are adopted. The etching gas is SF₆ under a pressure of 10 mTorrs, and the microwave power is 150 W. Under these conditions, the etching rate of the polycrystalline silicon is about 0.5 μm/min, and the selection ratio to the SiO₂ is 100 times or more. Incidentally, the etching is isotropic at a room temperature. If, however, the wafer is cooled to $-100°$ C. to $-135°$ C., the etching can be anisotropic even at a similar selection ratio.

Figure 1B:
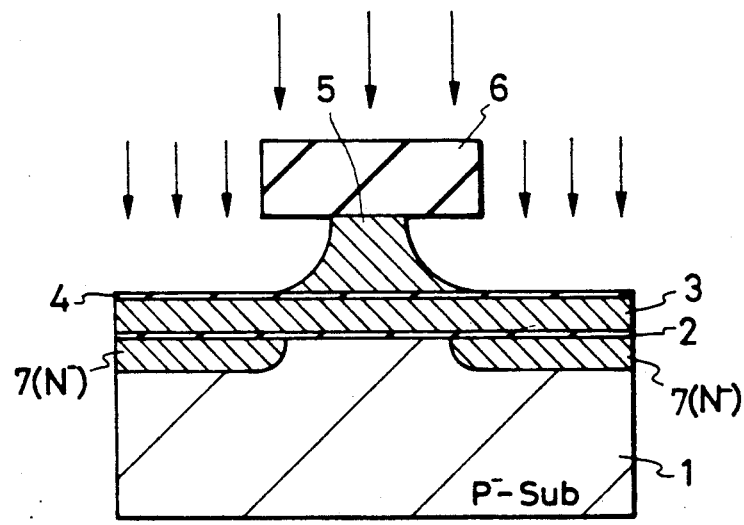

After this, a lightly doped source/drain 7 is formed by an ion implantation using the $SiO_2$ film 6 as a mask, as shown in FIG. 1B. This ion implantation is accomplished through the natural oxide film 4 and the polycrystalline silicon film 3.

The ion implantation is accomplished with P ions in a concentration of $1 \times 10^{13}$ atoms/cm$^2$ by a power of 80 KeV so that the lightly doped source/drain region may have a concentration of about $7 \times 10^{17}$ atoms/cm$^3$.

After this, a $SiO_2$ film 8 is deposited all over the substrate by the CVD method. This film is formed at 800° C. for 125 minutes to have a thickness of 2,500 Å by supplying gases of $N_2O$ and $SiH_4$.

Thanks to this CVD method, the overhanging portion of the $SiO_2$ film 6 can also be formed with the $SiO_2$ film 8 without any gap.

Figure 1C:
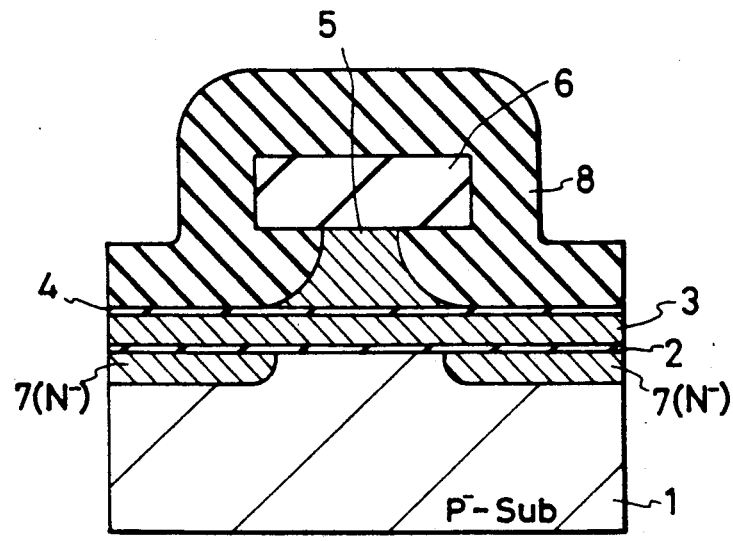
Figure 1D:
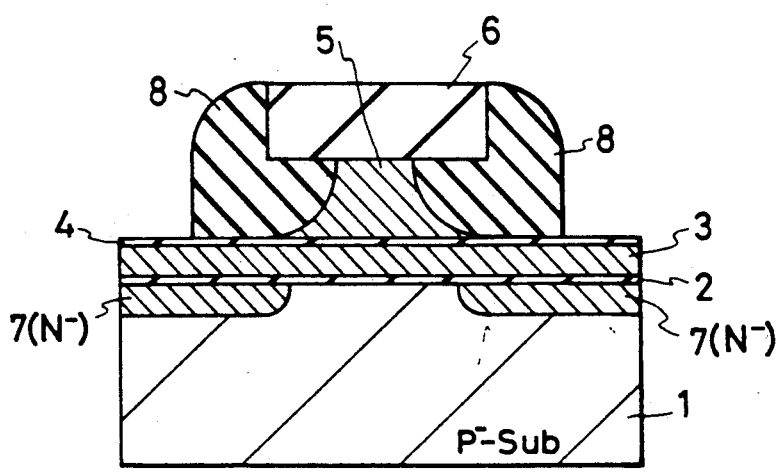

This state is shown in FIG. 1C.

Subsequently, the $SiO_2$ film 8 is anisotropically etched back all over its surface to leave the gateside wall insulating film 8 only at the side wall of the gate. The structure at this stage is shown in section in FIG. 1D.

Since the transverse etching is reluctant according to the anisotropic etching, the $SiO_2$ film 8 can be left at the side-wall portion of the step if a predetermined distance (corresponding to the deposit thickness) from the top surface is etched.

The anisotropic etching at this time uses the RIE method under the same conditions as those of the $SiO_2$ film 6.

Figure 1E:
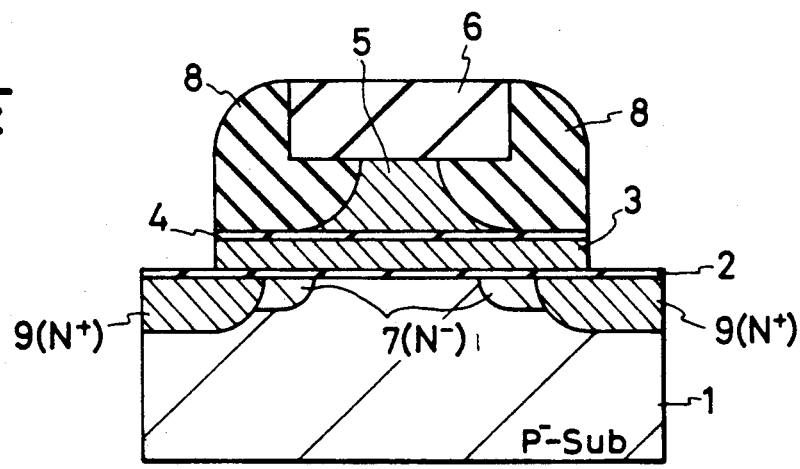

Next, as shown in FIG. 1E, the natural oxide film 4 and the polycrystalline silicon film 3 are anisotropically etched away by using the $SiO_2$ film and the gate-side wall insulating film 8 as masks.

Here, this anisotropic etching at this time uses the RIE method under the following conditions.

The etching gas is $CCl_4$; the pressure is 50 mTorrs; and the power is 0.3 W/cm$^2$.

A highly doped source/drain 9 is formed by implanting ions of an impurity of the same conductivity type as that of the lightly doped source/drain with a high concentration.

Since the highly doped source/drain 9 is formed by the ion implantation using the $SiO_2$ film 8 as a mask, it is formed in a self-alignment.

The ion implantation of the highly doped source/drain 9 is accomplished with an ion of As in a power of 80 eV and in a concentration of $5 \times 10^{15}$ atoms/cm$^2$ to have a final density of $2 \times 10^{20}$ atoms/cm$^3$.

The detailed steps for fabricating the embodiment thus far described can be applied to other embodiments to be described in the following. Although these embodiments are not so detailed as the first embodiment, they can be easily understood by those skilled in the art with reference to the description of the first embodiment.

According to the present embodiment, it is possible to accurately control the thickness of the polycrystalline silicon film 3 etched and to allow the film 3 and the lightly doped source/drain 7 in an overlapping manner to overhang the side wall of the gate.

As a result, the overlapping effect of the gate/drain (or source) can damp the channel electric field in the vicinity of the drain and can suppress injection of the hot carrier into the spacer insulating film of the gate side wall, which will raise a problem in the ordinary LDD.

According to the present embodiment, an element of high breakdown voltage can be realized by the controllable and simple process.

Figure 2:
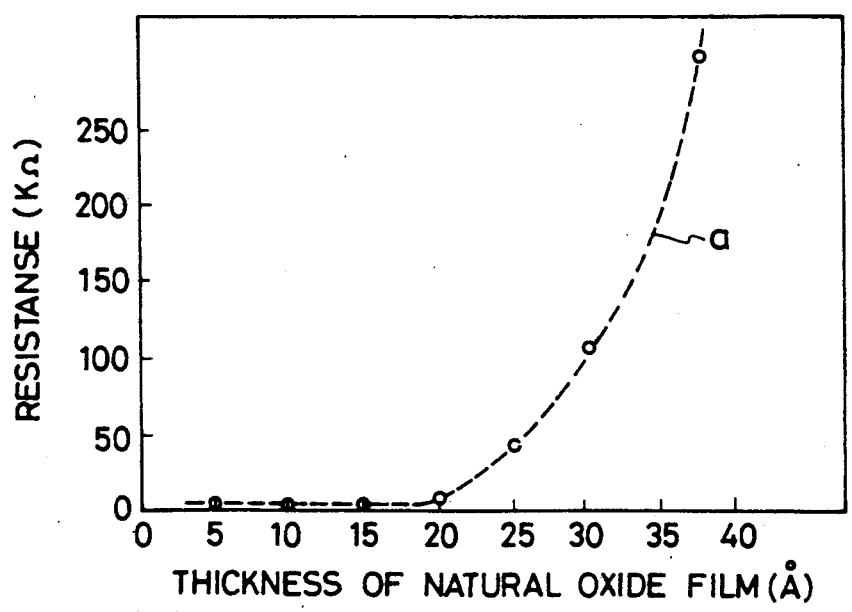
FIG. 2 is a diagram plotting the relation between the thickness of a natural oxide film and a resistance thereof.

Incidentally, since the natural oxide film 4 is as thin as 5 to 10 Å, the impurity such as phosphorus having doped the polycrystalline silicon film 5 will also diffuse into the polycrystalline silicon film 3 to establish an electric conduction. This will be described with reference to FIG. 2. FIG. 2 plots a curve a indicating the increase in the electric resistance of the natural oxide film with the increase in the thickness of the same film. As seen from FIG. 2, the electric resistance can be substantially ignored up to the thickness of about 20 Å. As a result, the conductive films at the two sides across the natural oxide film are at an equal potential in the embodiment of the present invention because the film thickness is as thin as 5 to 10 Å.

EMBODIMENT 2

Figure 3:
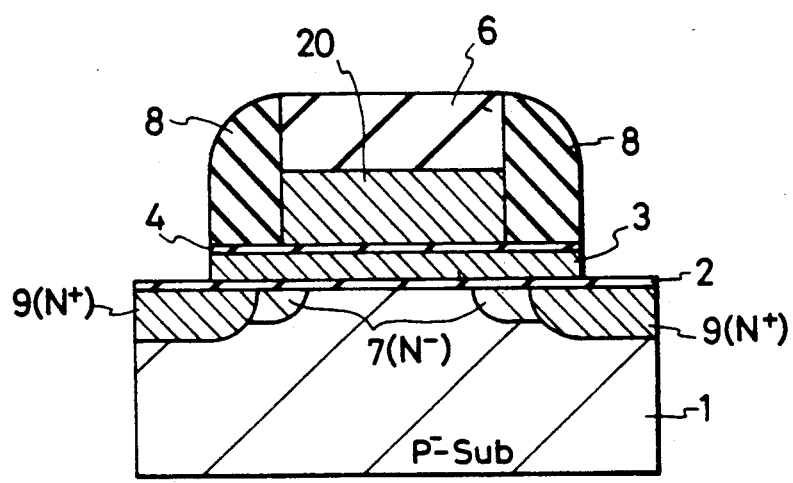
FIGS. 3 to 10 are sections for explaining second to ninth embodiments of the present invention.

FIG. 3 shows a second embodiment, in which a gate electrode film 20 is etched not isotropically but anisotropically. In this case, too, the etching conditions should be created such that the gate electrode film 20 and the natural oxide film 4 have a high etching rate (selective) ratio.

Here, a W gate electrode is formed by a low-temperature etching method with an etchant of $SF_6$ at a wafer temperature of about $-50°$ C.

According to this embodiment, the upper layer gate electrode film 20 can be inhibited from being otherwise thinned by the isotropic etching method.

EMBODIMENT 3

Figure 4:
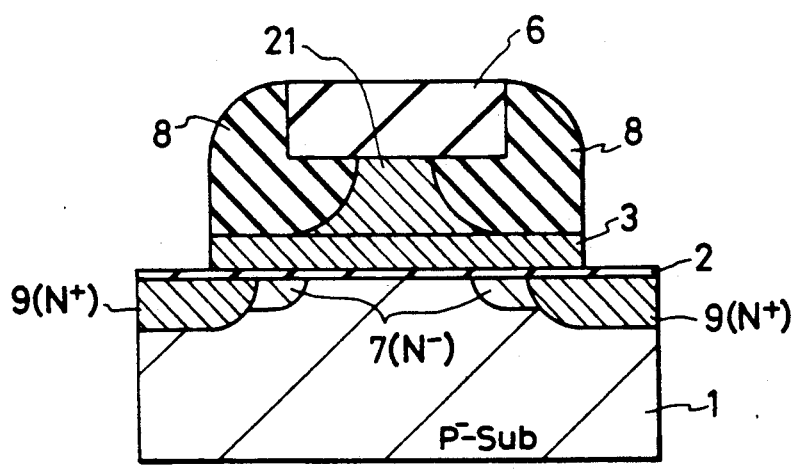

FIG. 4 shows a third embodiment of the present invention, in which a polycrystalline silicon film 21 is formed such that the concentration of a silicide such as tungsten silicide, a metal such as tungsten, or a conductive impurity such as phosphorus is higher than that of the polycrystalline silicon film 3. Since, in the present embodiment, the film 21 and the polycrystalline silicon film 3 have different etching characteristics, the etching operation can be accurately stopped at their interface. Especially in case the film 21 is made of a polycrystalline silicon film doped highly with phosphorus whereas the film 3 is made of an undoped polycrystalline silicon film, the etching rate of the RIE method using $CCl_4$ as an etchant is dropped at the undoped film. This eliminates the necessity for intentional formation of the natural oxide film 4.

Incidentally, the resistance of the under gate electrode can be dropped if an impurity is uniformly diffused into the upper and lower layer gate electrodes by a heat treatment after the pattern formation by the etching method.

EMBODIMENT 4

Figure 5:
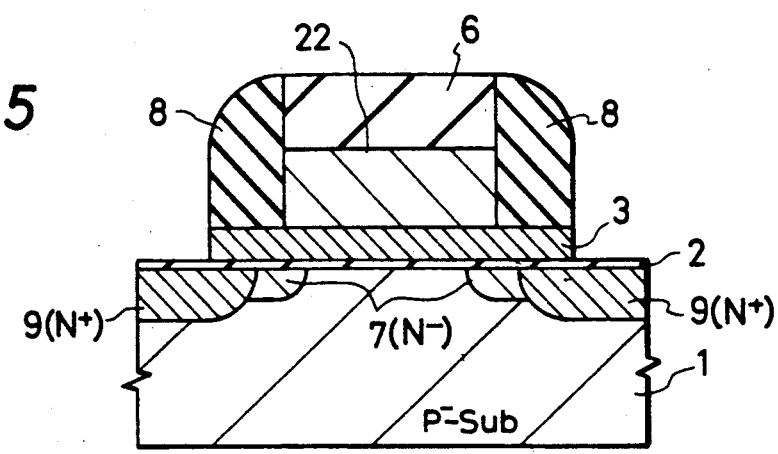

FIG. 5 shows a fourth embodiment in which there is used a conductive film 22 having an anisotropic etching rate different from that of the film 3. A conductive film 22 used is TiN. According to the present embodiment, too, the etching operation can be stopped at the interface with the polycrystalline silicon film 3. There can be attained another effect that the film 22 can be prevented from being otherwise thinned by the etching operation while eliminating the necessity for intentionally forming the etching stopped film 4.

EMBODIMENT 5

Figure 6A:
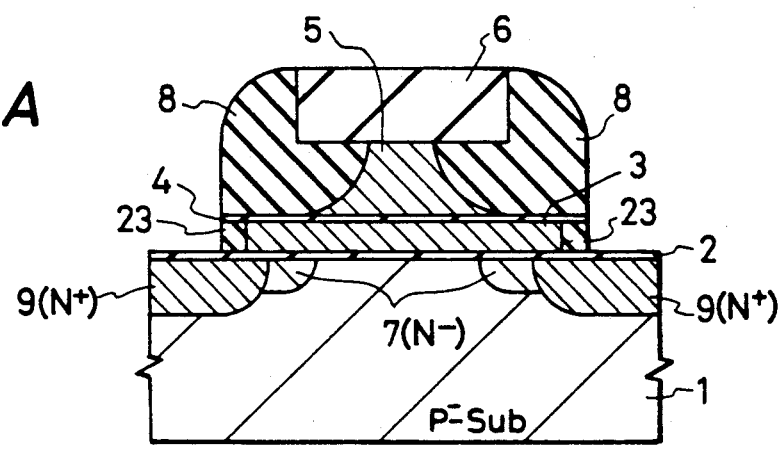
Figure 6B:
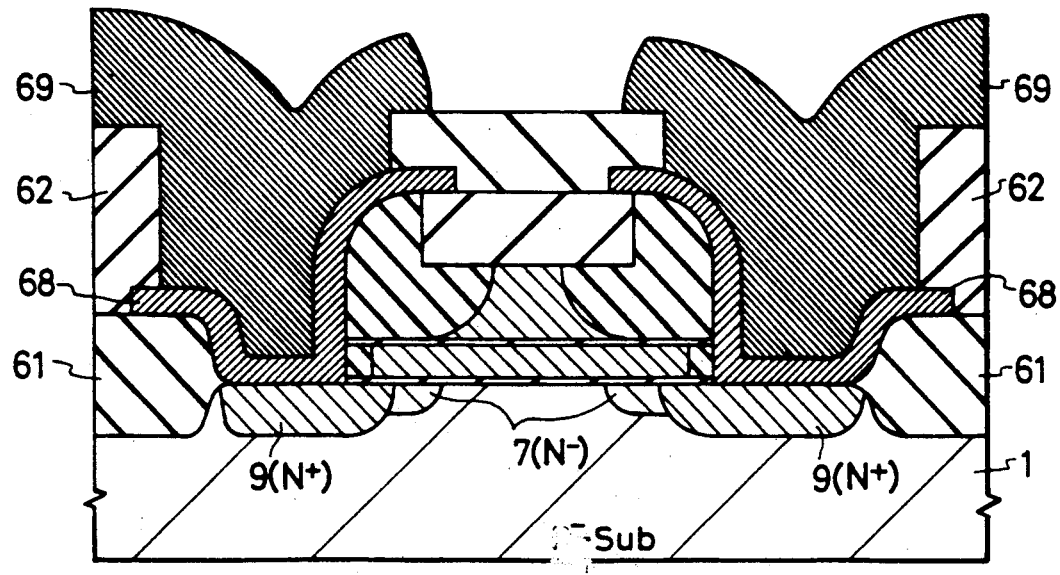

FIGS. 6A and 6B show a fifth embodiment, in which the polycrystalline silicon film 3 of FIG. 1E is formed with an oxide film 23. This oxide film 23 is formed on the side wall of the film 3 by making the structure of FIG. 1D, by etching the films 3 and 4 using the SiO$_2$ film and the gate side wall insulating film 3 as masks and by oxidizing them. After this, the highly doped source/drain 9 is formed by a highly doping operation with an impurity of the same conductive type as that of the lightly doped source/drain 7.

Incidentally, a suitable method for forming the oxide film 23 is the wet oxidation at a low temperature. The polycrystalline silicon film 3 is highly doped with an impurity such as phosphorus. According to the wet oxidation at a low temperature, the oxidation rate of the polycrystalline silicon film 3 can be made higher than that of the substrate 1.

According to the present embodiment, the films 5 and 3 for acting as the gate electrode are covered with the insulating films 6, 8 and 23 so that the contact of the source/drain can be formed in a self-aligned manner.

This will be described in connection with the structure shown in FIG. 6B. FIG. 6A is a section showing the structure in which an extension is made to cover an insulating separation film (or LOCOS film) 61 in the visual field to form an underlying film 68 of polycrystalline silicon, an inter-layer insulating film 62 and a metal wiring 69.

In FIG. 6B, the source/drain region 9 has its contact portion defined by the insulating films 23 and 61 to make it unnecessary to newly form the contact holes. Here, the polycrystalline silicon film 68 is deposited all over the surface to accomplish a rough photolithography. Since it is sufficient for at least a portion of the polycrystalline silicon film to contact with the source/drain region, insufficient contact hardly arises even with more or less dislocation to the right or left. The inter-layer insulating film 62 is formed thereover with the contact holes. Since, in this case, the polycrystalline silicon film 68 also has a considerable size (to above the gate electrode and the insulating separation film), the contact holes and the polycrystalline silicon film 68 will be hardly dislocated. At last, the wiring layer 69 of aluminum is formed. The polycrystalline silicon film 68 also has a function to prevent the metal wiring layer 69 from diffusing into the silicon substrate (or the source/drain region 9).

The oxide film 23 formed in the present embodiment may be applied to the embodiments of FIGS. 2, 3 and 4, as will be naturally understood.

EMBODIMENT 6

Figure 7:
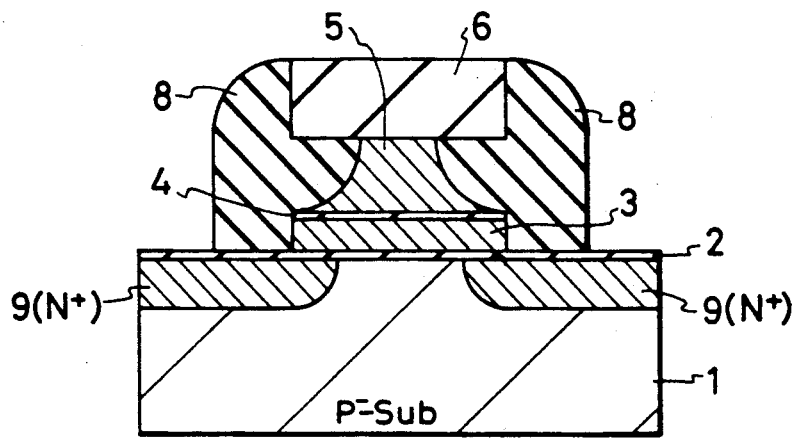

FIG. 7 shows a sixth embodiment in which the LDD (Lightly Doped Drain) structure of the first embodiment is replaced by an SD (Single Drain) structure. In the present embodiment, the source/drain 9 is formed by performing an ion implantation in a high density through the polycrystalline silicon film 3 using the SiO$_2$ film 6 as a mask. After this ion implantation, the polycrystalline silicon film 3 is etched away using the SiO$_2$ film 6 as a mask. Because of the ion implantation with a high energy through the polycrystalline silicon film 3, the impurity profile in the depthwise and channel directions immediate after the ion implantation have gentle gradients. As a result, even with the use of arsenic, the junction does not become abrupt but can form a gently gradient diffusion layer like the phosphorus so that the channel field can be damped even with the SD structure of arsenic.

Incidentally, the embodiments of FIGS. 2, 3, 4 and 5 may have their LDD structures replaced by the SD structure.

EMBODIMENT 7

Figure 8:
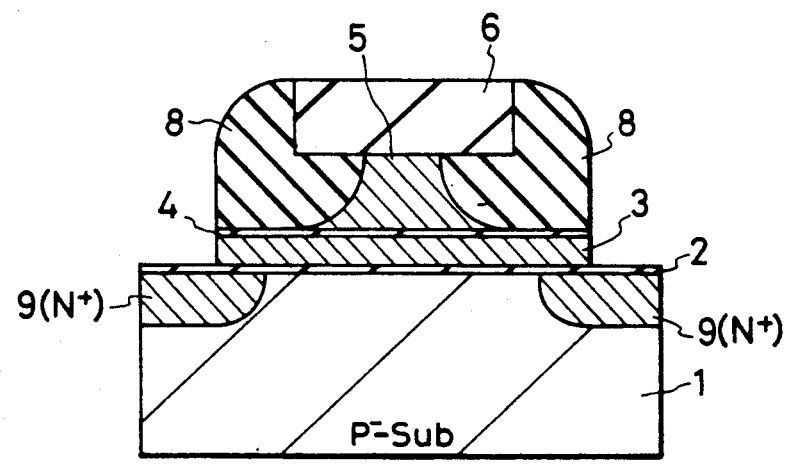

FIG. 8 shows a seventh embodiment in which the highly doped source/drain 9 described in the embodiment of FIG. 6 is formed by an ion implantation through the conductive film 3 using the gate side wall insulating film 8 as a mask.

The fabricating process is similar to the first embodiment up to the step of working the gate electrode using the SiO$_2$ film 6 as the mask. After this working of the gate electrode, the gate side wall insulating film 8 is left by a method similar to that for making the ordinary LDD structure. At this stage, the conductive film 3 still remains. Next, the source/drain 9 is formed by an ion implantation in a high concentration through said film 3, and the conductive film 3 is then etched away. According to the present embodiment, a higher current can be established than that obtained by the LDD structure having the gate side wall insulating film 8, and a higher breakdown voltage can also be established than that of the embodiment of FIG. 7.

EMBODIMENT 8

Figure 9:
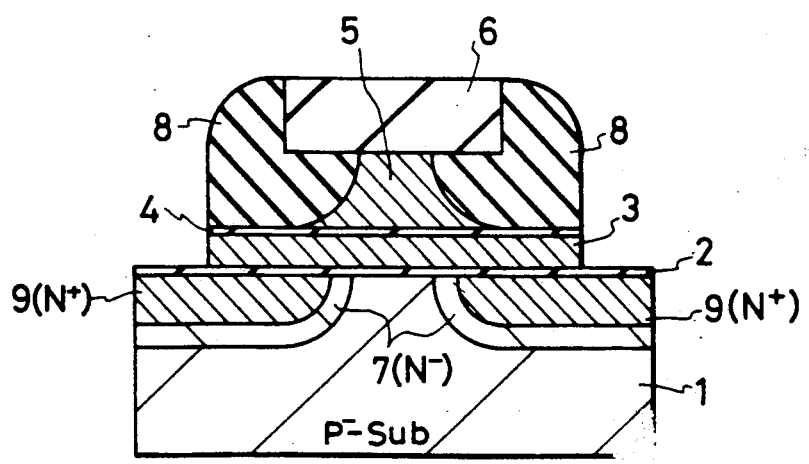

FIG. 9 shows an eighth embodiment in which the source/drain of the first embodiment is constructed of a DDD (Double Diffused Drain) structure. The lightly doped source/drain 7 having a gently gradient impurity profile is formed by implanting ions in a self-alignment with the gate electrode and through the conductive film 3 with the mask of the SiO$_2$ film 6. The heavily doped source/drain 9 is also formed by an ion implantation through the conductive film 3. After this, the structure of FIG. 9 is obtained by etching the conductive film 3 with the mask of the insulating film 8 while leaving said mask on the gate electrode side wall. The present embodiment is characterized by the gently gradient impurity profile even when an impurity such as arsenic is used in the heavily doped source/drain 9.

EMBODIMENT 9

Figure 10:
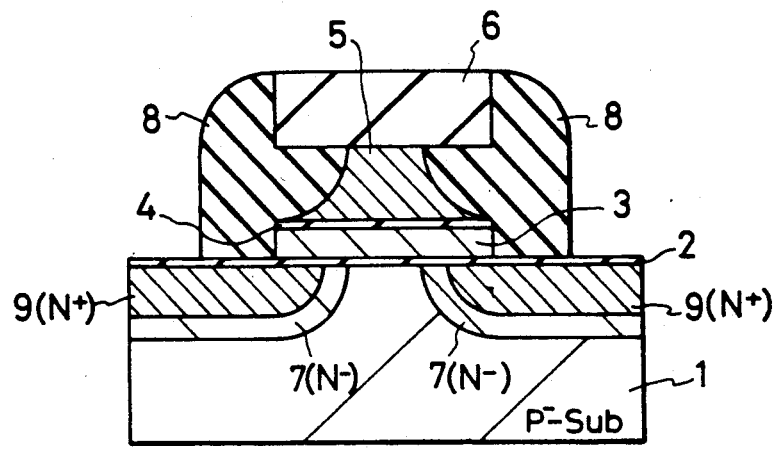

FIG. 10 is a ninth embodiment, in a case where the heavily doped source/drain 9 having the DDD structure of FIG. 9 is formed by implanting ions directly into the substrate, not through the conductive film 3. Like the embodiment of FIG. 1, the lightly doped source/drain 7 having the gently gradient profile is first formed. Subsequently, the conductive film 3 is anisotropically etched by using the SiO$_2$ film 6 as a mask. In this state, the heavily doped source/drain 9 is then formed by doping with an impurity with the mask of the SiO$_2$ film 6. The gate side wall insulating film 8 is formed by a method similar to that of the ordinary LDD structure. FIG. 10 is a section showing after the formation of the gate side wall insulating film 8.

According to the present invention, it is possible to reduce the extension of the diffusion layer in the channel direction of the heavily doped source/drain 9. This makes it possible to increase the length of the lightly doped source/drain 7 in the DDD structure thereby to enhance the electric field damping effect due to the DDD structure.

Incidentally, the source/drain structures thus described with reference to FIGS. 8 to 10 may be applied in replacement by the source/drain structures described in connection with the embodiments of FIGS. 2 to 5.

According to the present embodiment, it is possible to accurately control the thickness of the gate electrode film overhanging in the inverse-T shape from the side wall of the gate. This possibility leads to an effect that the thickness of the side-wall gate can be set at a small value such as 20 to 30 nm according to the present invention. This raises an additional effect that the impurity profile of the source/drain to be formed by the ion implantation through the side-wall gate can be accurately controlled. Since, moreover, the side-wall gate can be thinned, the impurity profile after the ion implantation can be prevented from becoming unnecessarily wider.

EMBODIMENT 10

Figure 11A:
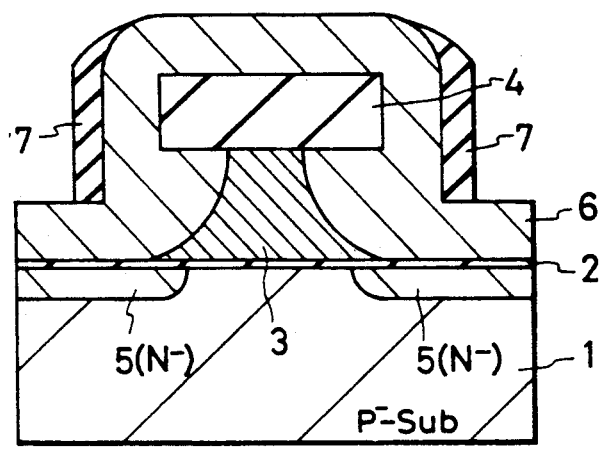
FIGS. 11A to 19 are sections for explaining tenth to eighteenth embodiments of the present invention.
Figure 11B:
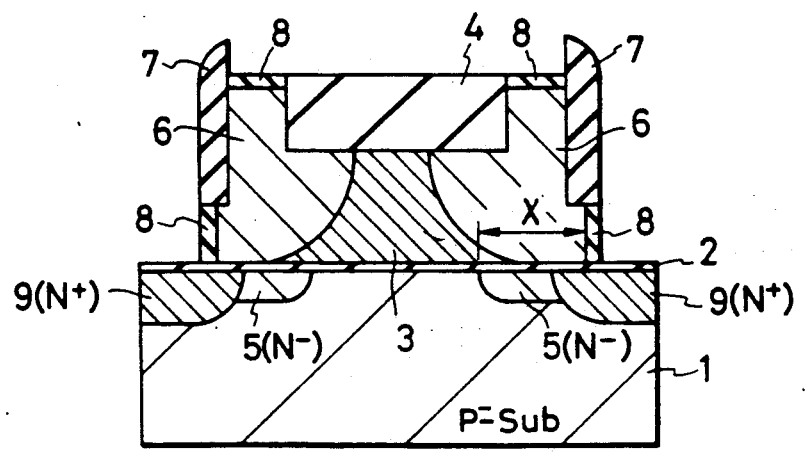

FIGS. 11A and 11B are sections showing the steps of a process for fabricating a semiconductor device according to a tenth embodiment of the present invention. Specifically, FIG. 11A is a section showing the structure in the vicinity of the gate electrode at the individual steps, and FIG. 11B shows the structure of the semiconductor device of the present invention.

The step up to the formation of the gate insulating film 2 over the Si substrate 1 is similar to the step of forming an ordinary MOS transistor. After the formation of the gate insulating film 2, the polycrystalline silicon film 3 is deposited all over the surface and is then doped with an impurity such as phosphorus (P). After this, the $SiO_2$ film 4 is deposited by the CVD (Chemical Vapor Deposition). Next, a not-shown photoresist film is applied to the $SiO_2$ film 4 by a well-known photolithography and is patterned in the shape of the gate electrode. After this, the $SiO_2$ film 4 is etched, as shown in FIG. 11A, by using the photoresist film as a mask. Subsequently, the polycrystalline silicon film 3 is isotropically etched into the shape as shown in FIG. 11A by the microwave etching method using the $SiO_2$ film 4 as a mask. In this state, the lightly doped source/drain region 5 is formed by implanting the ions therefor using the $SiO_2$ film 4 as a mask. After this, the polycrystalline silicon film 6 and the gate side wall insulating film 7 are deposited all over the surface. Moreover, the polycrystalline silicon film 6 is doped with a conductive impurity such as phosphorus. The gate side-wall insulating film 7 thus deposited all over the surface is etched back so that it may be left only at the side wall of the gate electrode (i.e., the bulging portion of the polycrystalline silicon film 6). The structure in the vicinity of the gate electrode in this state is shown in section in FIG. 11A.

In this state, the polycrystalline silicon film 6 is anisotropically etched back. Next, the exposed etching surface of the polycrystalline silicon film 6 is thermally oxidized to form the $SiO_2$ film 8. After this, the heavily doped source/drain region 9 is formed by heavily implanting the ions of an impurity of the same conductivity type as that of the lightly doped source/drain region 5 in a self-aligned manner by using the formed gate electrodes (6 and 3) as a mask. The structure of this state is shown in section in FIG. 11B.

In the present embodiment, the polycrystalline silicon film (i.e., the side-wall gate) 6 is formed thick overlapping the lightly doped source/drain region 5 after the ion implantation for forming the same region 5. As a result, there arises an effect to compensate the thinning of the polycrystalline silicon film 3 due to the isotropically etching. This in turn drops the wiring (electric) resistance of the gate electrode. Moreover, the polycrystalline silicon film 6 constitutes no barrier against the ion implantation for forming the lightly doped source/ drain region 5. Moreover, the overlap of the gate/drain establishes actions to damp the channel field and to suppress deterioration of the hot carriers intrinsic to the LDD. According to our experimental findings, the extent of the overlap of the gate/drain exerts serious influences upon the characteristics of a transistor. Specifically, the following effects are brought about by covering at least the region contacting the gate insulating film of the depleted region of the source/drain region established by a voltage application with a gate electrode. That is to say: (1) the transverse field to be applied to the depleted region of the drain region is damped; (2) the transmission conductance in the depleted region increases; and (3) the hot carrier injection into the gate side-wall insulating film raising a problem in the LDD structure can be prevented to control the potential in the vicinity of the substrate surface of the lightly doped drain region with the gate electrode thereby to suppress the characteristic deterioration due to the hot carriers (i.e., the pinch-off phenomenon of the lightly doped source/drain due to the trapped hot carriers).

Incidentally, the present invention has an action to arbitrarily control a very important overlap x for the characteristics of the transistor with the thickness of the oxide film $(SiO_2)$ film 8, i.e., the degree of thermal oxidation.

EMBODIMENT 11

Figure 12A:
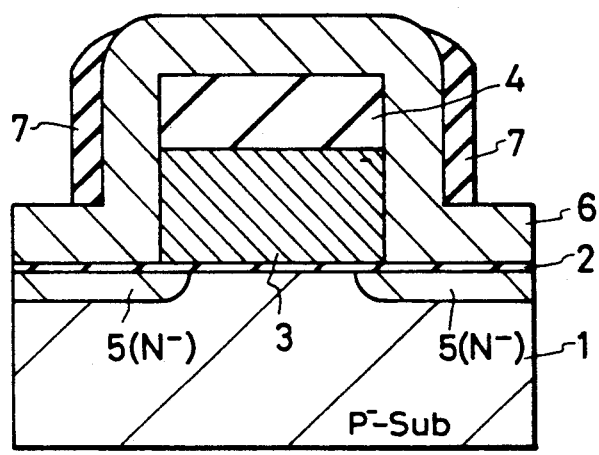
Figure 12B:
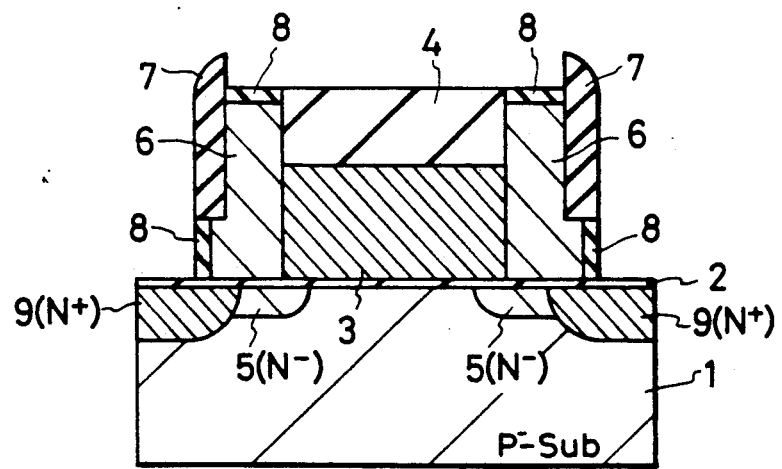

FIGS. 12A and 12B are sections showing the steps of a process for fabricating the eleventh embodiment of the present invention and the structure thereof.

In the foregoing tenth embodiment, the isotropic etching method has been used to etch the polycrystalline silicon film 3 using the $SiO_2$ film 4 as the mask. In the present embodiment, on the contrary, the polycrystalline silicon film 3 is anisotropically etched. The remaining structure is similar to that of the tenth embodiment. The present embodiment can naturally enjoy the effects similar to those of the tenth embodiment.

Incidentally, in the tenth and eleventh embodiments, the films 3 and 6 should not be limited to the polycrystalline silicon films but may be films of silicide or metal or their composite films.

EMBODIMENT 12

Figure 13A:
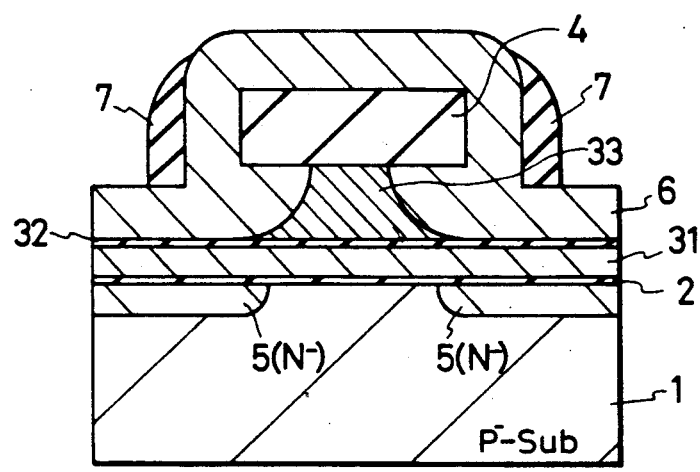
Figure 13B:
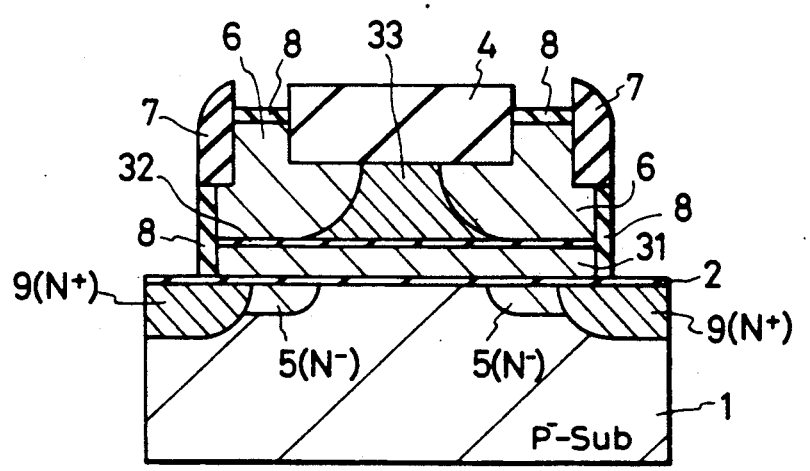

FIGS. 13A and 13B are sections showing the steps of a process for fabricating the twelfth embodiment of the present invention and the structure of the same.

In the present embodiment, the ion implantation for forming the lightly doped source/drain region 5 is performed through a film 31 made of polycrystalline silicon, for example, and the electrode film 6 is applied to the gate side wall. The fabricating process will be described with reference to FIGS. 13A and 13B.

First of all, as shown in FIG. 13A, the step up to the formation of the gate insulating film 2 over the Si substrate 1 is similar to that of the embodiment of FIG. 11A. After this gate insulating film 2 is formed, the polycrystalline silicon film 31 is deposited all over the surface to have a thickness of 30 to 50 nm. Subsequently, the preform is extracted from the CVD system and exposed to the atmosphere to grow a natural oxide film 32 having a thickness of 5 to 20 Å over the surface of said film 31. After this, a polycrystalline silicon film 33 is deposited again, and the polycrystalline silicon films 33 and 31 and the natural oxide film 32 are doped with a conductive impurity such as phosphorus. Subsequently, the $SiO_2$ film 4 is deposited all over the surface by the CVD method and is then anisotropically etched into the shape of the gate electrode by the photolithography. Then, the polycrystalline silicon film 33 is first isotropically etched by the microwave etching method using the etched $SiO_2$ film 4 as a mask. Since the etching rate of the oxide film by the microwave etching method is slower by one or two orders than that of the polycrystalline silicon film, the etching of the polycrystalline silicon film 33 can be accurately stopped at the boundary of the natural oxide film 32. After this etching of the polycrystalline silicon film 33, ions are implanted for forming the lightly doped source/drain region 5 by using the $SiO_2$ film as a mask. The impurity ions are implanted into the Si substrate 1 through the remaining polycrystalline silicon film 31. This makes it impossible to thicken said film 31 so much.

The suitable thickness of the film 31 is 30 to 50 nm, in case the source/drain region is formed by the ion implantation with phosphorus, and 50 to 100 nm in case the source/drain region is formed by the ion implantation with arsenic.

After the formation of the lightly doped source/drain region 5, the polycrystalline silicon film 6 is deposited all over the surface and is doped with an impurity such as phosphorus so that it may be conductive. After this, the gate side-wall insulating film 7 is formed like the embodiment of FIG. 11A, as shown in section in FIG. 13A.

Next, the polycrystalline silicon films 6, 32 and 31 are anisotropically etched using the gate side-wall insulating film 7 as a mask. The oxide film 8 is formed over the etched surfaces of those films to control the overlap of the gate/drain, and the heavily doped source/drain region 9 is formed. After these steps, the structure takes the shape shown in FIG. 13B.

In the present embodiment, the polycrystalline silicon film 6 to be applied to the gate electrode side wall after the formation of the lightly doped source/drain region 5 acts to compensate the thickening of the polycrystalline silicon film 33, and to thicken the side-wall gate of the thinned gate electrode side wall, thereby reducing the electric resistance.

By leaving the side-wall gate 31 of the gate electrode side wall, moreover, there arises an effect that the damage and contamination of the gate insulating film 2 following the ion implantation can be lightened to suppress the failure of the gate breakdown voltage. This effects makes it necessary to set the thickness of the film 31 at such a value as to avoid the damage otherwise coming from the ion implantation but not to constitute a barrier against the ion implantation. As a result, the suitable thickness of said film 31 in the polycrystalline silicon film is 30 to 50 nm in the case of the phosphorus ion implantation and 50 to 100 nm in the case of the arsenic ion implantation.

The electric resistance up to the film thickness of 20 Å can be substantially ignored, as has been described with reference to FIG. 2. Since, in the embodiment of the present invention, the thickness of the natural oxide film 32 is as small as 5 to 20 Å, as has been described above, the two conductive films 31 and 6 across the natural oxide film 32 take equal potential. In other words, the natural oxide film 32 does not constitute a barrier against the impurity diffusion in the gate electrode and against the electric conduction.

The present embodiment can enjoy another effect that the thickness of the film 31 to be left can be accurately controlled by the use of the natural oxide film 32. As a result, it is possible to accurately control the impurity profile of the lightly doped source/drain region 5 implanted through the film 31.

EMBODIMENT 13

Figure 14:
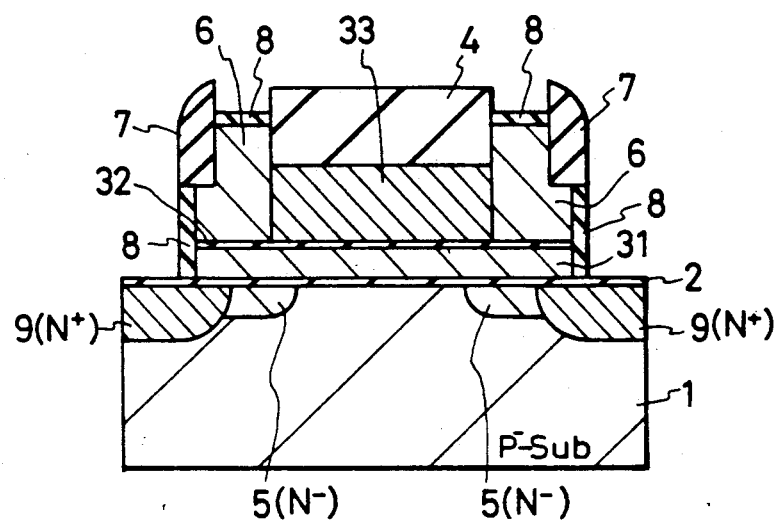

FIG. 14 is a section showing a thirteenth embodiment of the present invention.

In the present embodiment, the film 33 of the embodiment of FIGS. 13A and 13B is anisotropically etched, and the remaining structure is absolutely similar to that of the embodiment of FIGS. 13A and 13B. The present embodiment can also enjoy effects similar to those of the embodiment of FIGS. 13A and 13B.

Incidentally, the films 31 and 33 appearing in FIGS. 13B and 14 should not be limited to the polycrystalline silicon films but may be conductive films made of silicide, metal or the like. It is especially important that the film 6 overhanging the gate electrode side wall should be made of a conductive film having a low electric resistance. Moreover, the film 32 should not be limited to the natural oxide film but may be any film if it has an etching rate lower than that of the film 33 and raises no obstruction against the conductivity between the films 33 and 31. The film 32 may be made of a thin metal film.

EMBODIMENT 14

Figure 15:
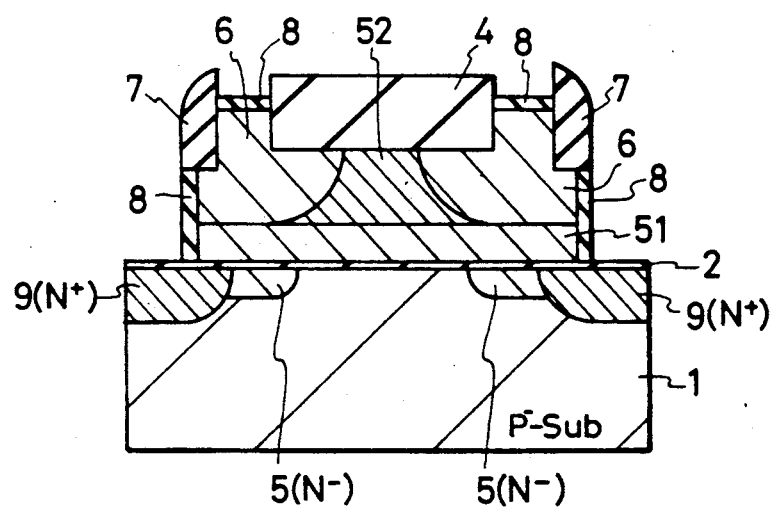

FIG. 15 shows an embodiment in which the natural oxide film 32 is eliminated from the embodiment of FIGS. 13A and 13B to form a structure similar to that of FIG. 13B. The steps up to the formation of the gate insulating film 2 are similar to those of FIG. 13B. After the gate insulating film 2 is formed, an undoped polycrystalline silicon film 51 is first deposited all over the surface, and a polycrystalline silicon film 52 doped heavily with an impurity such as phosphorus is deposited by the CVD method without forming any natural oxide film. In this state, the diffusion of the impurity of phosphorus from the film 52 to the film 51 is suppressed. The $SiO_2$ film 4 is anisotropically etched and used as a mask to isotropically etch the film 52. At this time, the etching of the film 52 in the vicinity of the boundary between the films 52 and 51 can be accurately stopped by making use of the characteristic that the doped film has a higher etching rate than that of the undoped film. The subsequent steps are similar to those of the embodiment of FIGS. 13A and 13B to provide a structure as shown in section in FIG. 15.

Incidentally, the impurity diffusion into the film 51 can be realized from the film 52 or 6 by anhealing the side-wall gate 6 formed at the gate side wall.

EMBODIMENT 15

Figure 16:
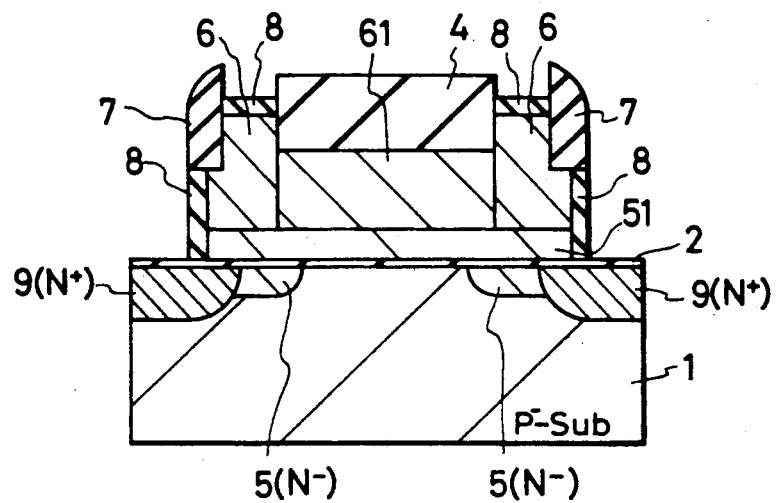

FIG. 16 shows a fifteenth embodiment in case the film 52 of FIG. 15 is replaced by a conductive film 61 of silicide or tungsten whereas the film 61 is anisotropically etched.

In FIG. 15, too, the films 51, 52 and 6 should not be limited to the polycrystalline silicon films but may be any conductive films. This likewise applies to the structure of FIG. 16.

The embodiments of FIGS. 15 and 16 can also enjoy the effects similar to those of the embodiment of FIG. 13B.

EMBODIMENT 16

Figure 17:
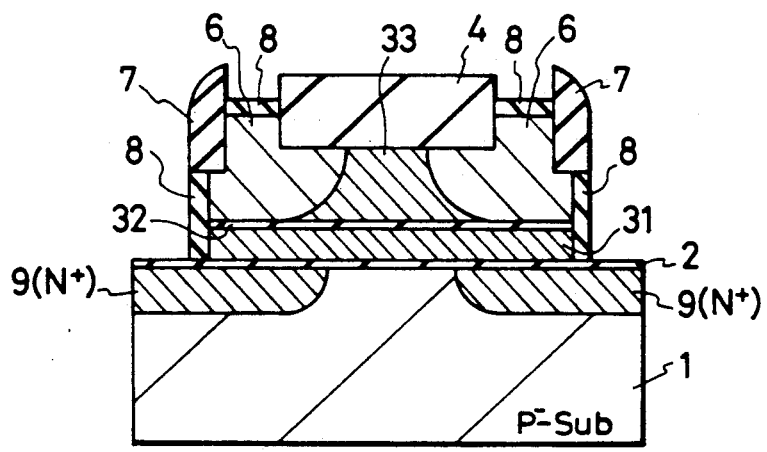

FIG. 17 shows a sixteenth embodiment in which the LDD (Lightly Doped Drain) structure of the source/drain of the embodiment of FIG. 13B is replaced by the SD (Single Drain) structure having no lightly doped source/drain region. The heavily doped source/drain region 9 is formed by an impurity doping method using the SiO$_2$ film 4 as a mask. In FIGS. 11B, 12B, 13B, 14, 15 and 16, the LDD structures may naturally be replaced by the SD structures.

EMBODIMENT 17

Figure 18:
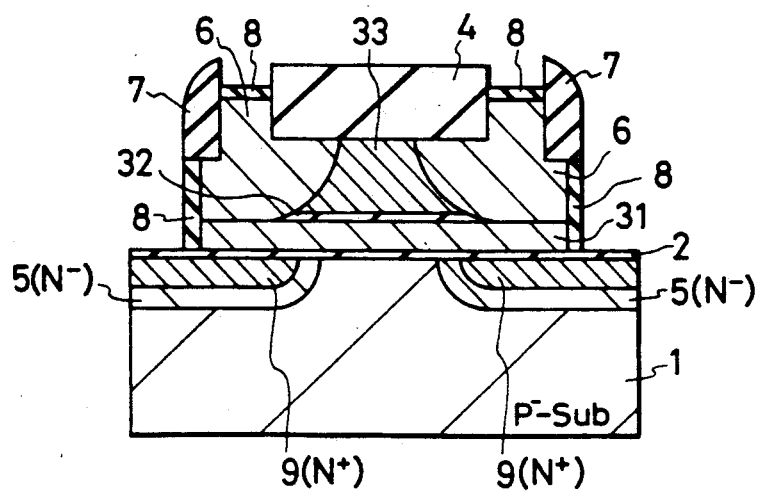

FIG. 18 shows a seventeenth embodiment in which the natural oxide film 32 of the embodiment of FIG. 13B is formed in the junction plane between the films 33 and 31. Since the film 33 is junctioned to the film 31 through the film 6, according to the present embodiment, the conduction between the films 33 and 31 can be guaranteed without any influences of the natural oxide film 32 grown thick. In the present embodiment, the film 33 is accurately etched by making use of the natural oxide film 32, and the exposed portion of the natural oxide film 32 is then etched before the deposition of the film 6.

Incidentally, in FIG. 18, the source/drain structure is constructed of the DDD (Double Diffused Drain) structure but may naturally be the LDD or SD structure. In the tenth to sixteenth embodiments, moreover, the source/drain structure may apparently be the DDD structure.

EMBODIMENT 18

Figure 19:
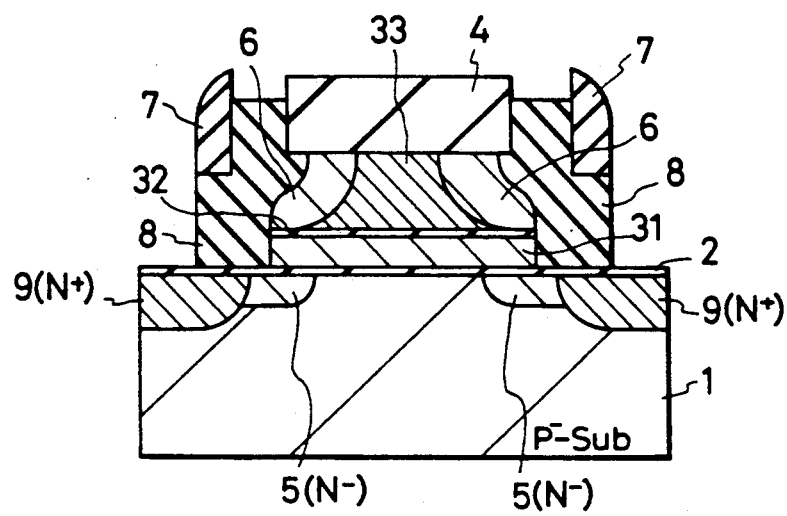

FIG. 19 shows an eighteenth embodiment in case the gate electrode 31 does not overlap the heavily doped source/drain region 9. What is overlapped by the gate electrode 31 is the depleted region of the lightly doped source/drain region 5. The damping of the drain electric field due to the overlap of the gate/drain is achieved by overlapping only the depleted region of the lightly doped source/drain region with the gate. The damping effect of the electric field is left constant even if the gate overlaps more than that depleted region. Thus, according to the present embodiment, the increase in the gate capacity due to the unnecessary overlap can be suppressed to damp the drain electric field sufficiently. Incidentally, the present structure can be formed by thickening the gate side wall oxide film 8 of the structure of FIG. 13B.

Figure 20:
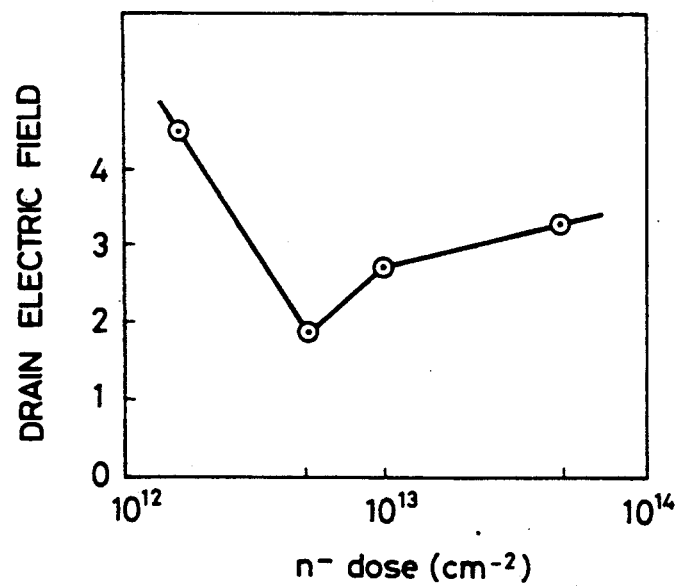
FIG. 20 is a diagram plotting the relation between the density of a lightly doped source/drain region and the intensity of a drain electric field.

Now, the width of the depleted region of the lightly doped source/drain region 5 becomes the larger for the smaller dope (i.e., n$^-$ dose) of the doping impurity of the lightly doped source/drain region. Since the drain electric field is damped by widening the depleted region, the low n$^-$ dose is desirable, as shown in FIG. 20. For the excessively low dose, however, the electric field is concentrated at the junction between the lightly doped drain and the heavily doped drain to a rather higher level. The optimum n$^-$ dose is seen to be about $5 \times 10^{12}$ cm$^{-2}$ from FIG. 20. At this time, the width of the depleted region is about 0.2 μm if a voltage of 5 V is applied to the drain. Therefore, the suitable overlap of the gate/drain is about 0.2 μm.

As has been described hereinbefore, according to the tenth to eighteenth embodiments of the present invention, the following effects can be obtained because the thickness of the side-wall gate overlapping the source/drain region is increased after the impurity doping for forming said source/drain region.

First of all, the ion implanting energy can be suppressed to a value lower than 100 KeV for the phosphorus to prevent the damage otherwise caused by the ion implantation, because the side-wall gate is not formed during the impurity doping for forming the source/drain region or its thickness can be set at a value to constitute no barrier against the ion implantation.

Since, moreover, the gate electrode can be thickened or made of a composite film having a low electric resistance after the formation of the source/drain region, the electric resistance of the gate electrode can be dropped. As a result, it is possible to suppress the delay of signal transmission due to the wiring resistance of the gate line.

EMBODIMENT 19

The following group of embodiments combine the semiconductor devices of the first to eighteenth in various manners.

If the new devices such as the DDD structure or the LDD structure are put into practice, as has been described hereinbefore, it is customary to construct almost all the devices of the same kind on one chip. This is because the common provision of devices by different processes on a single chip would increase the number of steps and still the worse the rise in the fabrication cost.

Especially the mixed packaging of the DDD and LDD devices has never been accomplished because of the differences in the device structures and the optimum process conditions. Despite of this fact, however, even the LDD devices are not the ultimate device structures but have a problem of the insufficient breakdown voltage in a submicron region. This problem makes it difficult to use the ULSI constructed of the LDD structure with a power of 5 V. In place of the LDD structure, therefore, the device GOLD (Gate-drain Overlapped Device) of high breakdown voltage are described in connection with the first to eighteenth embodiments. The GOLD structure is a device for realizing the high breakdown voltage and current by making positive use of the overlap of the gate/drain (or source). However, only one problem of the GOLD structure is an increase in the gate capacity. Therefore, the prior art process for constructing the ULSI structure only with the GOLD structure can solve the problem of the breakdown voltage, but the problem of the increase in the gate capacity becomes rather more serious than the case in which the ULSI structure is constructed with the LDD structure.

The embodiments to be described hereinafter purpose to realize a ULSI of totally high breakdown voltage, high speed and high density by constructing the ULSI structure through proper use of the merits and demerits of the various structures GOLD, LDD, DDD and SD. This purpose can be achieved by selecting and selectively using the device structures suited for the objects, applications and performances of the individual parts composing the ULSI.

The minimum size of the GOLD suited for the high breakdown voltage and current, to which the power of 5 V can be applied, can be micronized to 0.4 to 0.5 μm, as compared with the LDD. This micronization makes the GOLD suitable for the portion which requires the power of 5 V and the increase in integration and current. It suits best especially for the transistor for driving a large wiring capacity and diffusion layer capacity. On the other hand, the LDD can be applied to the p-MOS, which is not followed seriously by the problem of breakdown voltage yet, the portion of an n-MOS which can take a large gate size from the point of the layout, or the portion requiring no speed. A similar concept allows the DDD and SD to be used properly. Since the ULSI thus constructed can sufficiently extract the individual performances of the devices, it can have higher density, speed and breakdown voltage than the LSI of the prior art.

A nineteenth embodiment of the present invention will be described with reference to FIGS. 21.

In this embodiment, the ULSI is constructed by forming transistors A and B of different structures on the Si substrate 1. In this embodiment, these two kinds of transistors are isolated by an element isolating oxide film 11. Moreover, each transistor provides a structure up to the step at which heavily doped source/drains 9 and 19 are formed. This step is followed by many steps of forming inter-layer insulating films, electrode wirings and so on.

The transistor A has the GOLD (Gate-drain Overlapped Device) structure as shown in FIG. 6A. On the other hand, the transistor B has the LDD structure. These transistors are coupled in the ULSI in various manners through the wirings.

Especially the GOLD is effective if used as a driver for driving the wiring capacitor and the diffusion layer capacitor by making use of the high-current characteristics.

Next, the fabricating process will be described in the following. The steps up to the formations of the element separating oxide film 11 and the gate insulating film 2 over the Si substrate 1 are similar to those of fabricating the ordinary MOS transistor. After the channel ion implantation of the transistors, although not specified herein, the thin polycrystalline silicon film 3 of 30 to 100 nm is deposited all over the surface. After this, the polycrystalline silicon film 3 is once exposed to the atmosphere to form the natural oxide film 4 (of 5 to 10 Å) over the film 3. Subsequently, the polycrystalline silicon film 5 is deposited and doped with phosphorus. After this, the SiO$_2$ is deposited. Next, the film 6 is first worked by using the not-specified photoresist film as a mask. Next, the film 6 thus worked is used as the mask to isotropically etch the polycrystalline silicon film 5. This etching is stopped at the natural oxide film 4 to leave the film 3. At this stage, the photoresist film B is covered with the photoresist film to form the lightly doped source/drain 7 of the transistor A. Subsequently, this transistor A is covered with the photoresist film to form a lightly doped source/drain 71 of the transistor B. After this, the SiO$_2$ is deposited all over the surface. This SiO$_2$ film 8 is once isotropically etched away with the transistor A being covered with the photoresist film. When the transistor B has its film 3 exposed, this film 3 is anisotropically etched by using the film 6 as a mask. After the surface of the Si substrate 1 of the transistor B exposed to the etching atmosphere has been lightly oxidized, an SiO$_2$ film 8 is deposited again all over the surface. This SiO$_2$ film 8 is anisotropically etched such that it is left at the gate side walls of the transistors A and B. Another light oxidation is performed to form an oxide film on the surface of the Si substrate 1 and at the gate side wall 10 of the transistor A. After this, the heavily doped source/drains 9 and 91 are sequentially formed to provide the structure of the present embodiment.

EMBODIMENT 20

Figure 21:
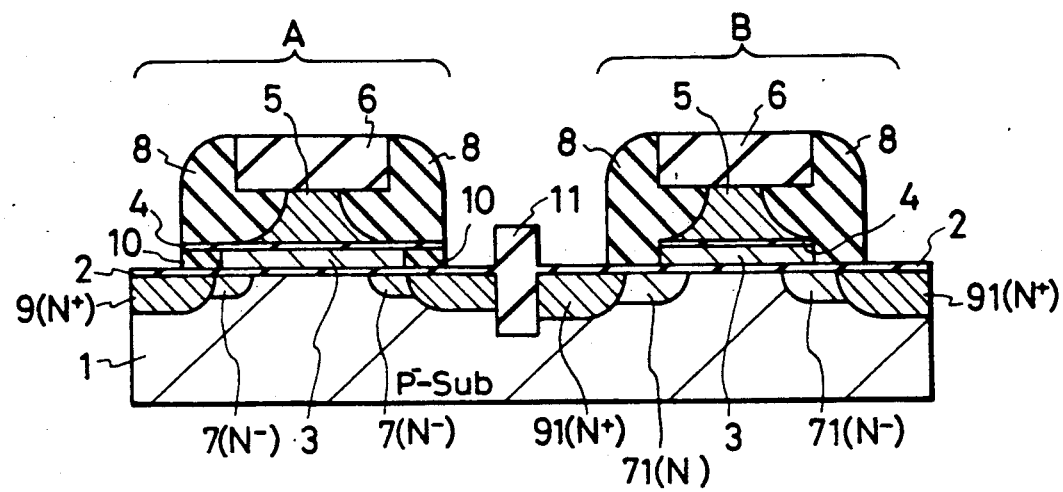
FIGS. 21 to 29 are sections for explaining nineteenth to twenty-sixth embodiments of the present invention.
Figure 22:
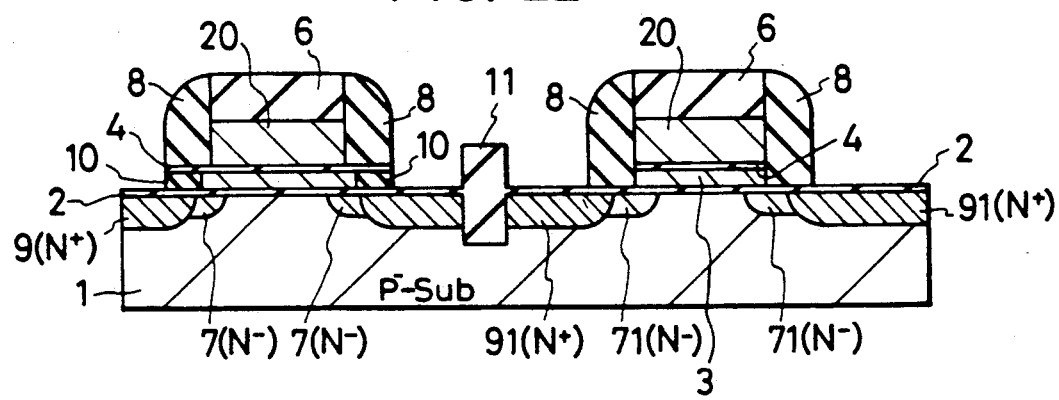

FIG. 22 shows a twentieth embodiment in which the film 5 of FIG. 21 is replaced by the film 20 of silicide or tungsten. In the present embodiment, this film 20 is anisotropically etched.

EMBODIMENT 21

Figure 23:
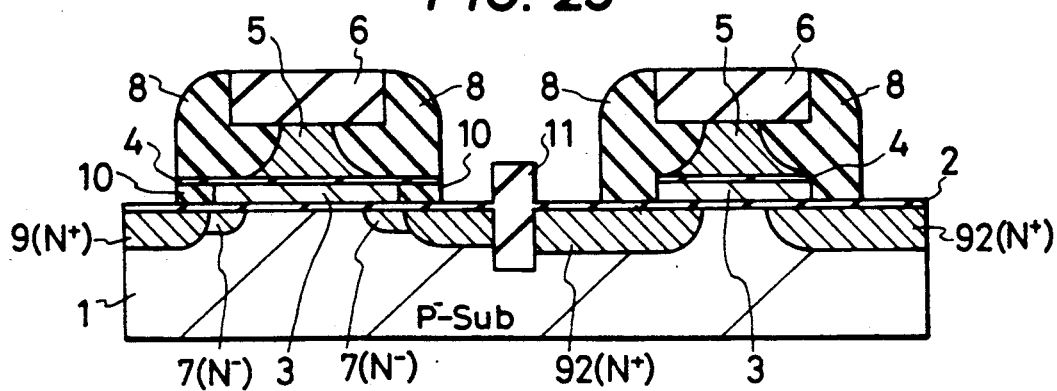

FIG. 23 shows a twenty-first embodiment in which the transistor B of FIG. 21 is constructed of the SD (Single Drain) structure. A heavily doped source/drain 92 is formed by using the SiO$_2$ film 6 as a mask.

EMBODIMENT 22

Figure 24:
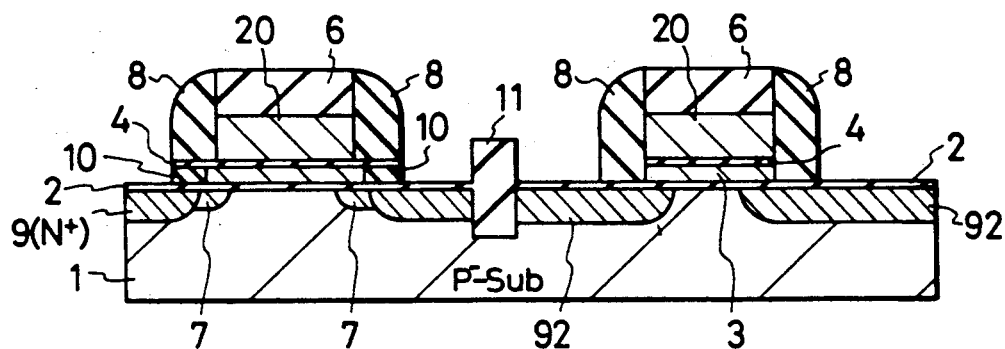

FIG. 24 shows a twenty-second embodiment in which the right-side transistor of FIG. 22 is constructed of the SD structure.

EMBODIMENT 23

Figure 25:
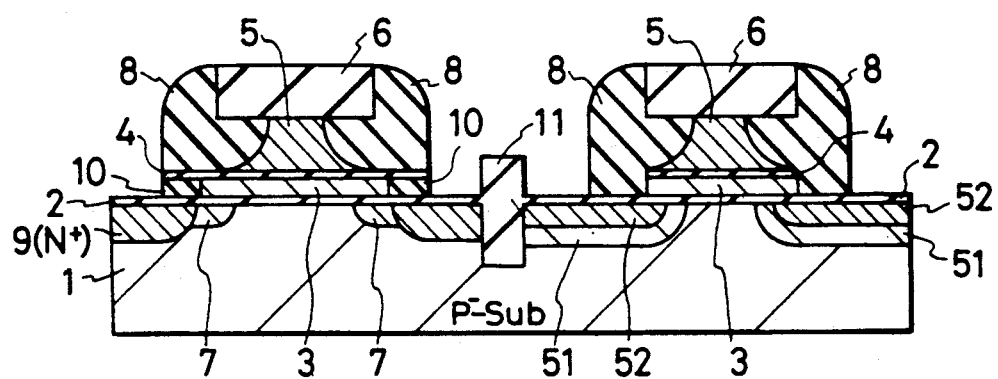

FIG. 25 shows a twenty-third embodiment in which the transistor B of FIG. 21 is constructed of the DDD (Double Diffused Drain) structure. Reference numeral 51 designates the lightly doped source/drain, and numeral 52 designates the heavily doped source/drain.

EMBODIMENT 24

Figure 26:
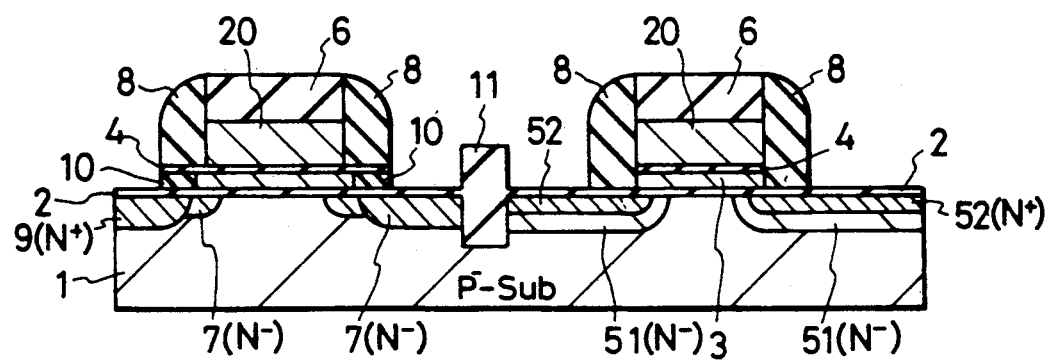

FIG. 26 shows a twenty-fourth embodiment in which the right-side transistor of FIG. 22 is constructed of the DDD structure.

In the DDD structures of FIGS. 25 and 26, the heavily doped source/drain 52 may be formed either by an ion implantation through the film 3 or by an ion implantation after the residual film 3 has been etched out.

EMBODIMENT 25

Figure 27:
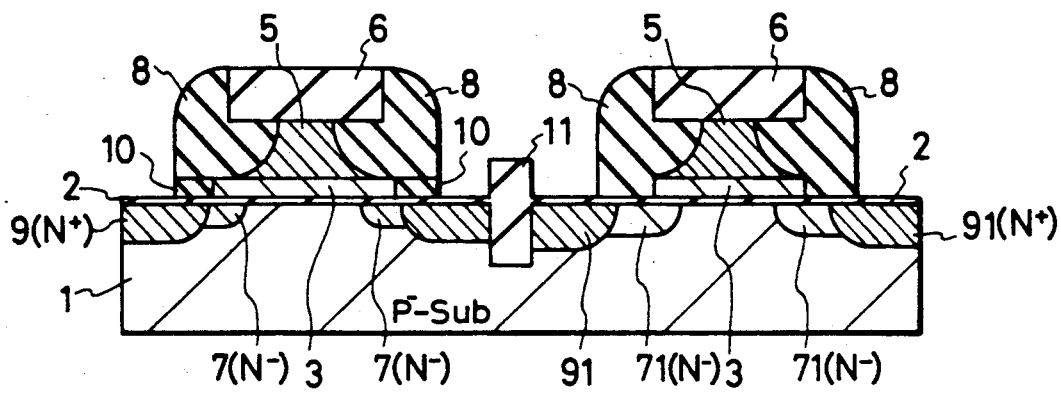

FIG. 27 shows a twenty-fifth embodiment in which none of the natural oxide film 4 is formed over the film 3 in the embodiment of FIG. 21. The film 5 should not be limited to the polycrystalline silicon film but may be a film of silicide or tungsten.

EMBODIMENT 26

Figure 28:
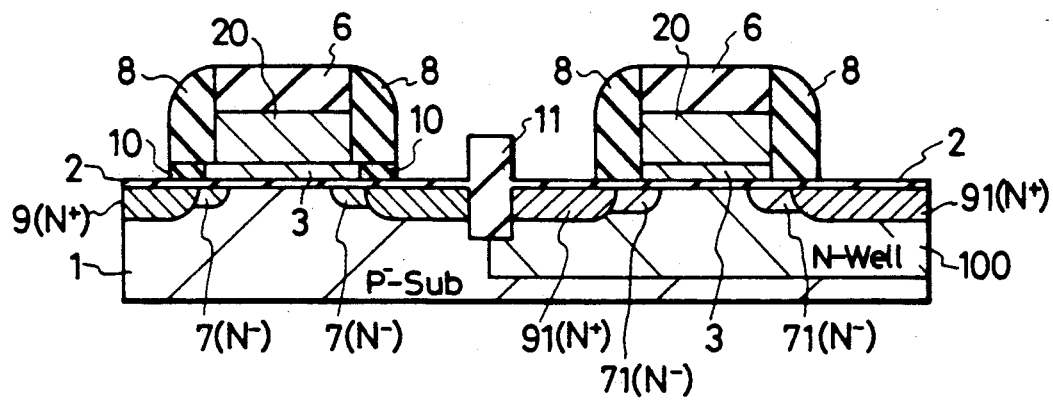
Figure 29:
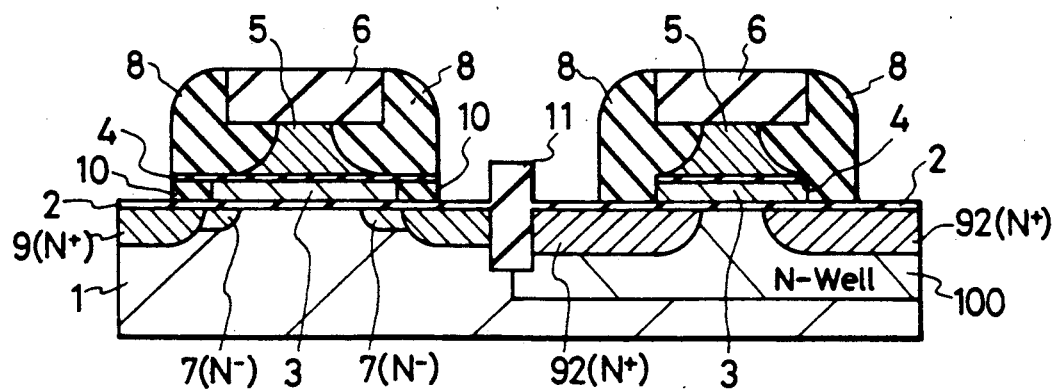

FIG. 28 shows a twenty-sixth embodiment in which the natural oxide film 4 is not formed like the embodiment of FIG. 27 and in which the right-side transistor is constructed of a p-MOS in an n-type well substrate 100 of a conductivity type opposite to that of the substrate 1. The lightly doped source/drain 71 and the heavily doped source/drain 91 are made of a p-type impurity. Incidentally, in the embodiments of FIGS. 21 to 27, the right-side transistor may apparently be of the conductivity type opposite to that of the left-side transistor and may be constructed of a p-MOS, as shown in FIG. 28. FIG. 29 shows an embodiment in which the SD structure of the p-MOS is formed.

According to the nineteenth to twenty-sixth embodiments, the transistor structure can be properly used in accordance with the objects and applications of the individual portions composing the ULSI. This makes it possible to make positive use of the merits of the individual transistor structures. For example, if the GOLD (Gate-Drain Overlapped Device) structure capable of using the power of 5 V and speeding up while guaranteeing the breakdown voltage up to 0.5 microns is applied to the n-MOS and if the p-MOS bringing no problem in the breakdown voltage is constructed of the LDD structure and operated on the voltage of 5 V, both the n-MOS and the p-MOS can be speeded up 2.2 to 2.3 times for the same gate length, as compared with the operation on 3 V. As a result, the delay due to the gate capacitor of the GOLD can rather be eliminated to realize a speed 1.2 to 1.3 times higher as the whole circuit. Thus, the present invention can realize the ULSI of high speed, high density and high breakdown voltage.

Incidentally, the portion of the polycrystalline silicon film acting as the gate electrode, as exemplified, is the film doped with an n-type impurity but may be a polycrystalline silicon film doped with a p-type impurity.

It is further understood by those skilled in the art that the foregoing description is directed to the preferred embodiments of the disclosed device and that various changes and modifications may be made in the present invention without departing from the spirit and scope thereof.

What is claimed is:

1. A semiconductor device comprising:
    a semiconductor body;
    a gate insulating film formed on said body;
    a source region and a drain region formed in said body; and
    a gate electrode formed on said gate insulating film, wherein said gate electrode comprises a first polycrystalline silicon film, a natural silicon oxide film formed on the first polycrystalline silicon film, and a second polycrystalline silicon film formed on the natural silicon oxide film, and the first polycrystalline silicon film is larger than the second polycrystalline silicon film so as to form an inverse-T shape gate electrode, and wherein said natural silicon oxide film has a thickness not larger than 20 Å, so that electrical conduction between the first and second polycrystalline silicon films is provided.

2. A semiconductor device according to claim 2, wherein the drain region has first and second regions, an impurity concentration of the first region being less than an impurity concentration of said second region, and wherein the first region of the drain region extends to a location beneath the first polycrystalline silicon film.

3. A semiconductor device according to claim 1, further comprising sidewall insulating films at sides of the second polycrystalline silicon film.

4. A semiconductor device according to claim 3, further comprising sidewall insulating films at sides of the first polycrystalline silicon film.

5. A semiconductor device according to claim 2, wherein the natural silicon oxide film has a thickness of 5–10 Å.

6. A semiconductor device according to claim 1, further comprising an insulating film at a side wall of the gate electrode.

7. A semiconductor device according to claim 1, wherein the first polycrystalline silicon film has a thickness of 30 to 50 nm, and wherein ions of one of phosphorus and arsenic are implanted with energies in single charge conversion of 60 to 80 KeV and 130 to 150 KeV, respectively, through the first polycrystalline silicon film of 30 to 50 nm, thereby forming the source region and the drain region.

8. A semiconductor device according to claim 1, wherein said source region and said drain region each include a lightly doped region and a heavily doped region sequentially in a direction extending apart from said gate electrode, and wherein said lightly doped region is completely covered with said gate electrode.

9. A semiconductor device according to claim 1, wherein at least a depletion region of said drain region, formed by a voltage application, is covered with said first polycrystalline silicon film.

10. A semiconductor device according to claim 1, wherein at least said drain region is composed of a lightly doped region and a heavily doped region sequentially in a direction extending apart from said gate electrode.

11. A semiconductor device according to claim 1, wherein said source region and said drain region are each composed of a lightly doped region and heavily doped region sequentially in a direction extending apart from said gate electrode, and wherein at least a depletion region of said drain region, formed by a voltage application, is covered with said first polycrystalline silicon film.

12. A semiconductor device according to claim 1, wherein a depletion region of said drain region, formed by a voltage application, is covered with said first polycrystalline silicon film.

13. A semiconductor device according to claim 1, further comprising sidewall insulating films at sides of the first polycrystalline silicon film.

14. A semiconductor device according to claim 1, wherein the first and second polycrystalline silicon films have sidewall insulating films at sides thereof, the sidewall insulating films at the sides of the first and second polycrystalline silicon films being an integral sidewall insulating film provided at the sides of both the first and second polycrystalline silicon films.

15. A semiconductor device according to claim 1, wherein both the first polycrystalline silicon film and the second polycrystalline silicon film are doped with an impurity to lower the electrical resistance thereof.

16. A semiconductor device according to claim 15, wherein the impurity doped into the second polycrystalline silicon film is the same as the impurity doped into the first polycrystalline silicon film.

17. A semiconductor device according to claim 15, wherein the natural oxide film is doped with said impurity.

18. A semiconductor device comprising:
    a semiconductor body having first conductivity type;
    a gate insulating film formed on said body;
    a source region and a drain region formed in said body, the source and drain regions having a second conductivity type; and
    a gate electrode formed on said gate insulating film, wherein said gate electrode comprises a first polycrystalline silicon film, a natural silicon oxide film formed on the first polycrystalline silicon film, and a second polycrystalline silicon film formed on the natural silicon oxide film, and the first polycrystalline silicon film is larger than the second polycrystalline silicon film so as to form an inverse-T shape gate electrode,
    wherein the drain region has first and second regions having the second conductivity type, an impurity concentration of the first region being less than an impurity concentration of the second region,
    wherein the first region of the drain region extends beneath the first polycrystalline silicon film, and
    wherein said natural silicon oxide film has a thickness of 5 to 10 Å, so that electrical conduction between the first and second polycrystalline silicon films is provided.

19. A semiconductor device according to claim 18, wherein an insulating film is grown at a side wall of the gate electrode.

20. A semiconductor device according to claim 18, wherein said first polycrystalline silicon film has a thickness of 30 to 50 nm.

21. A semiconductor device according to claim 18, wherein at least a depletion region of said drain region, formed by a voltage application, is covered with said first polycrystalline silicon film.

22. A semiconductor device according to claim 18, wherein a depletion region of said drain region, formed by a voltage application, facing said gate insulating film, is covered with said first polycrystalline silicon film.

* * * * *